US00RE40976E

(19) United States
(12) Reissued Patent
Bergemont et al.

(10) Patent Number: US RE40,976 E
(45) Date of Reissued Patent: Nov. 17, 2009

(54) COMMON SOURCE EEPROM AND FLASH MEMORY

(76) Inventors: Albert Bergemont, 4145 Byron St., Palo Alto, CA (US) 95306; Gregorio Spadea, 18600 Perego Way, Saratoga, CA (US) 95070

(21) Appl. No.: 11/198,860

(22) Filed: Aug. 4, 2005

Related U.S. Patent Documents

Reissue of:
(64) Patent No.: 6,606,265
Issued: Aug. 12, 2003
Appl. No.: 10/002,607
Filed: Oct. 30, 2001

U.S. Applications:
( 60) Provisional application No. 60/244,620, filed on Oct. 30, 2000.

(51) Int. Cl.
*G11C 16/04* (2006.01)

(52) U.S. Cl. ..... 365/185.01; 365/185.05; 365/185.33

(58) Field of Classification Search ..... 365/185.05, 365/185.01, 185.14, 185.17, 185.27, 185.28, 365/185.33
See application file for complete search history.

(56) References Cited

U.S. PATENT DOCUMENTS

| | | | | |
|---|---|---|---|---|
| 4,451,748 | A | | 5/1984 | Amrany |
| 4,972,371 | A | | 11/1990 | Komori et al. |
| 5,097,444 | A | | 3/1992 | Fong |
| 5,398,204 | A | | 3/1995 | Maruyama |
| 5,732,018 | A | * | 3/1998 | Choi et al. ..... 365/185.17 |
| 5,745,417 | A | * | 4/1998 | Kobayashi et al. ..... 365/185.29 |
| 5,910,913 | A | * | 6/1999 | Kato et al. ..... 365/185.11 |
| 5,936,883 | A | | 8/1999 | Kurooka |
| 5,949,718 | A | | 9/1999 | Randolph et al. |
| 5,994,732 | A | | 11/1999 | Ajika |
| 6,243,298 | B1 | | 6/2001 | Lee et al. |
| 6,272,046 | B1 | | 8/2001 | Shimada |
| 6,288,938 | B1 | | 9/2001 | Park et al. |
| 6,310,800 | B1 | | 10/2001 | Takahashi |

FOREIGN PATENT DOCUMENTS

| | | |
|---|---|---|
| EP | 0326465 | 8/1989 |
| EP | 0655742 | 11/1993 |
| WO | WO02037502 | 5/2002 |

OTHER PUBLICATIONS

IEEE Standard Definitions and Characterization of Floating Gate Semiconductor Arrays; IEEE Standard 1005–1998; The Institute of Electrical and Electronics Engineers, Inc.; Approved Jun. 25, 1998.

USPTO: PCT International Search Report, Serial. No. PCT/US01/45319; Jul. 17, 2003; 4 pages.

USPTO; PCT International Preliminary Examination Report, Serial No. PCT/US01/45319; Aug. 18, 2005; 4 pages.

Patent Abstracts of Japan; NEC Corp.; JP Publication No. 58028875; Publication Date: Feb. 19, 1983; 1 page.

Patent Abstracts of Japan; Toshiba Corp.; JP Publication No. 62060266; Publication Date: Mar. 16, 1987; 1 page.

* cited by examiner

*Primary Examiner*—Gene N. Auduong
(74) *Attorney, Agent, or Firm*—Stolowitz Ford Cowger LLP

(57) ABSTRACT

A nonvolatile memory array is arranged as a plurality of rows and columns of memory cell transistors. The sources of the memory cell transistors in each row of the array are electrically coupled together. The control gates of the memory cell transistors associated with a row in the array are coupled to a wordline associated with that row. The drains of the memory cell transistors in a column of the array are coupled to a bitline associated with that column. A source transistor is associated with each row and has its source coupled to a common source line, its drain coupled to the sources of all memory cell transistors in that row, and a gate coupled to the wordline. An array of split-gate nonvolatile memory cells is also disclosed.

35 Claims, 7 Drawing Sheets

COMMON SOURCE EEPROM AND FLASH MEMORY

Matter enclosed in heavy brackets [ ] appears in the original patent but forms no part of this reissue specification; matter printed in italics indicates the additions made by reissue.

RELATED APPLICATIONS

This application claims the benefit of U.S. Provisional Application No. 60/244,620, filed Oct. 30, 2000.

BACKGROUND OF THE INVENTION

1. Field of the Invention

The present invention relates to semiconductor nonvolatile memories. More particularly, the present invention relates to an improved EEPROM and flash memories.

2. The Prior Art

Several types of nonvolatile memory cells have been used in commercial products for many years, ranging from EPROM to EEPROM and Flash memories. See, for example, "IEEE Standard Definitions and Characterization of Floating Gate Semiconductor Arrays" IEEE Std 1005-1998. The cited reference provides a good background of the various types of memory devices that have been produced and provide a list of the terms used in this disclosure.

EPROM and Flash memories usually employ a single MOS transistor with two gates stacked on top of each other, the floating gate and the control gate, and the conductive state of the transistor can be changed by injecting electrons onto or removing electrons from the floating gate. EEPROM (byte erasable) memories usually are fabricated with separate select and control gate (such as the FLOTOX cell), although there are examples of products where a split gate is also used.

The majority of the memory cells either of the stacked or split gate type, use the so called T layout where the sources of two cells on adjacent rows are mirrored along the center of a common source diffusion line and the sources of the all the memory transistors of the array are connected to a common terminal. During reading of the selected cell, the non selected memory transistors belonging to the selected bitline and which have been programmed to a conductive state (they conduct current even if abs(Vgs)<0) cannot be changed to a nonconductive during the read mode unless the voltage of the non selected wordlines can be set to be below $V_{ss}$ (for NMOS cells) or about $V_{cc}$ (for PMOS cells). Generation of these voltages complicates the design of the memories. As a result an uncontrolled amount of current (hereinafter called leakage current) flows through the selected bitline and the common source, making the correct reading of the state of the selected memory transistor very difficult.

This problem has been lessened by insuring that the memory transistor is never erased (for a NMOS cell) or programmed (for a PMOS cell) to a normally on state when the gate-source voltage is zero, or by adding the select gate to the memory transistor (split gate cell). A normally on MOS device is often called a depletion device.

An array configuration has been presented in U.S. Pat. No. 5,949,718 in which the common source of two adjacent rows is connected to two additional transistors whose gates are the wordlines of the rows and which are connected to a common potential (ground for the array described). Even without a split gate memory cell, the leakage current problem is reduced, but not completely eliminated. The reason is that when reading one cell, the source of the mirrored cell is also grounded. If this cell has been programmed to be normally on, it contributes current during reading and this make more difficult for the sensing circuitry to decide if the selected cell is on or off. The leakage problem is reduced as compared to the case of conventional arrays, which use a common source for the entire array, since the leakage is limited to one cell only. The solution of the problem is not to erase the memory cell into a normally on state, although in this case more off current can be tolerated.

Another problem with a conventional array using a stacked gate cell and a common source is referred to as a "drain turn-on" problem. As an example, in an array utilizing a NMOS memory cell, applying 6 V on the drain (the bitline) and 9 V on the wordline does the programming of the selected cell.

The wordline of the non-selected rows is kept at $V_{ss}$, but the drains of all the cells connected to the selected bitline are biased at 6 V. The capacitive coupling between the drain and the wordline will bring the potential of the floating gate to value comprised between 0 and 6 V. The actual value depends on the geometry of the cell and can be easily such that the non-selected cells are turned on. In this case each non-selected cell on the selected bitline is going to draw current and the total amount of current required for programming is increased.

BRIEF DESCRIPTION OF THE INVENTION

According to one aspect of the present invention, a nonvolatile memory array is arranged as a plurality of rows and columns of memory cell transistors. The sources of the memory cell transistors in each row of the array are electrically coupled together. The control gates of the memory cell transistors associated with a row in the array are coupled to a wordline associated with that row. The drains of the memory cell transistors in a column of the array are coupled to a bitline associated with that column. A source transistor is associated with each row and has its source coupled to a common source line, its drain coupled to the source of all memory cell transistors in that row, and a gate coupled to the wordline.

According to other aspects of the invention, an array of split-gate nonvolatile memory cell is provided. The array is arranged as a plurality of rows and columns of split-gate memory cell transistors. The sources of the split-gate memory cell transistors in each pair of adjacent rows of the array are electrically coupled together. The control gates of the memory cell transistors associated with a row in the array are coupled to a wordline associated with that row. The drains of the memory cell transistors in a column of the array are coupled to a bitline associated with that column. A source transistor is associated with each row and has its source coupled to a common source line, its drain coupled to the sources of all memory cell transistors in that row, and a gate coupled to the wordline.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons having the benefit of this disclosure.

The memory array configurations described herein completely eliminate the current leakage problem and the drain turn-on problem associated with prior-art memory arrays. In addition, the memory transistors can be programmed or erased without restrictions on the threshold voltage (the memory transistor can be set to operate as a depletion device) or the drain coupling ratio. This improves the cell read current for a given set of biasing condition during read, as compared to the case where the memory cell cannot be set to operate as a depletion device. This translates into a reduced read access time, or, for a given cell current, it allows the use of a lower power supply voltage.

The memory array configurations disclosed herein can employ either NMOS or PMOS memory cells of the stacked or split gate type. The memory cells disclosed herein use well-proven mechanisms for programming and erasing the cells. All of the array configurations can be used for implementing Flash memories organized in sectors or full-function EEPROM memories organized in bytes. One array configuration will be shown which can be used for implementing single poly EPROM function using a simple PMOS transistor as the memory element.

Figure 1:
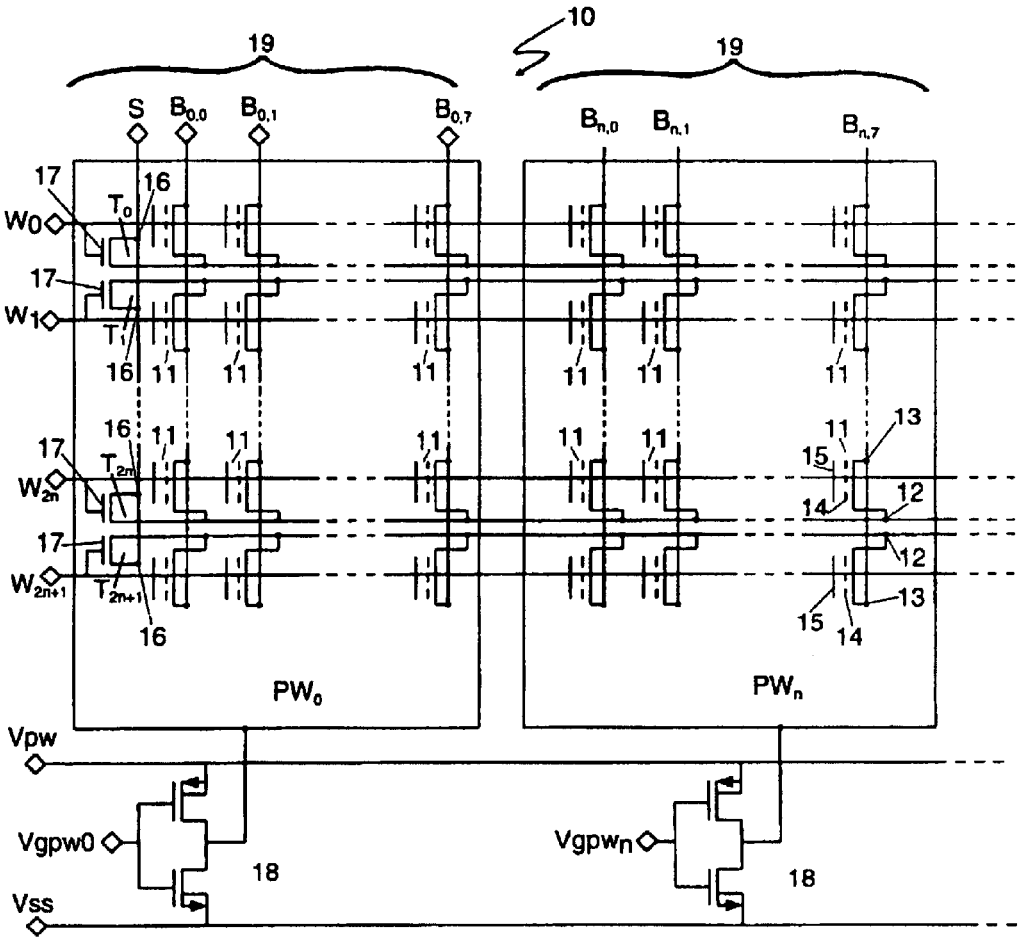
FIG. 1 is an electrical schematic diagram of a stacked memory array according to the present invention.

FIG. 1 is an electrical schematic diagram of the memory array of the nonvolatile memory cell array 10. The nonvolatile memory cell array 10 of FIG. 1, is made of NMOS single transistor memory cells including a nonvolatile memory transistor 11. These memory cells are similar to the ETOX cell developed by Intel. Each nonvolatile memory transistor 11, has a source 12, a drain 13, a floating gate 14, and a control gate 15.

Wordlines $W_0$, $W_1$, . . . $W_{2n}$, $W_{2n+1}$ are used to select half of a given row of nonvolatile memory transistors 11 of the nonvolatile memory cell array 10. Each of the wordlines $W_0$, $W_1$, . . . $W_{2n}$, $W_{2n+1}$ activates a row of control gates 15.

Bitlines, $B_{0,0}$, $B_{0,1}$ . . . $B_{0,7}$ are used to select of a given column of nonvolatile memory transistors 11 of the nonvolatile memory cell array 10. Each of the bitlines, $B_{0,0}$, $B_{0,1}$ . . . $B_{0,7}$ connected to a column of drains 13.

Source, S is used to select the N+ source diffusion common to each row of nonvolatile memory transistors 11. This is different from a typical ETOX array where the sources of two adjacent rows of transistors are merged. Each row of NMOS single transistor memory cells 11 of the nonvolatile memory cell array 10 has a source select transistors $T_0$, $T_1$, . . . $T_{2n}$, $T_{2n+}$ associated with it. The source select transistors $T_0$, $T_1$, . . . $T_{2n}$, $T_{2n+1}$ selects the N+ diffusion common for a row of NMOS single transistor memory cells 11. The source select transistors $T_0$, $T_1$, . . . $T_{2n}$, $T_{2n+1}$ source 16, is connect to the source S and the drain is connect to the row of nonvolatile memory transistor's 11 source 12. Each source select transistors $T_0$, $T_1$, . . . $T_{2n}$, $T_{2n+1}$ control gate 17 is activated by the Wordlines $W_0$, $W_1$, . . . $W_{2n}$, $W_{2n+1}$.

Each memory byte of NMOS single transistor memory cell nonvolatile memory transistors 11 of the nonvolatile memory cell array 10 are isolated within a P-well $PW_0$, $PW_1$ . . . $PW_n$ creating a well contained memory byte 19. The P-well can be biased to the appropriate P-well voltage $V_{pw}$, by using, for instance, the CMOS inverter 18. The CMOS inverter selects the P-well $PW_0$, $PW_1$, . . . $PW_n$ via the CMOS inverter gate $V_{gpw0}$, $V_{gpw1}$, . . . $V_n$ activated to Vcc.

The floating gate 14 of the array nonvolatile memory transistors 11 in nonvolatile memory cell array 10 is the memory cell. The erasure, programming and reading of the floating gate 14 of the NMOS single transistor memory cells 11 in nonvolatile memory cell array 10 is the memory cell voltages as indicated in Table 1. The values of the voltages indicated in Table 1 are typical of the type of cell, but they may vary depending on the process technology and the geometry of the cell.

As an example, the floating gate 14 (memory cell 0,0) is programmed when wordline $W_0$ is at +9 volts, with the rest of the wordlines $W_1$, . . . $W_{2n}$, $W_{2n+1}$ at 0 volts; and the bitline $B_0$ is at +6 volts, with the rest of the bitlines $B_{0,0}$, $B_{0,1}$ . . . $B_{0,7}$ at 0 volts. Source is at 0 volts, $V_{gpw0-n}$ at Vcc, and $V_{pw}$ at 0 volts. The floating gate 14 (memory cell 0,0) is selectively programmed by Channel Hot Electrons (CHE) injected into the floating gate 14 (memory cell 0,0) using the conditions mentioned above and the threshold is raised to a positive value safely above Vcc.

Figure 2:
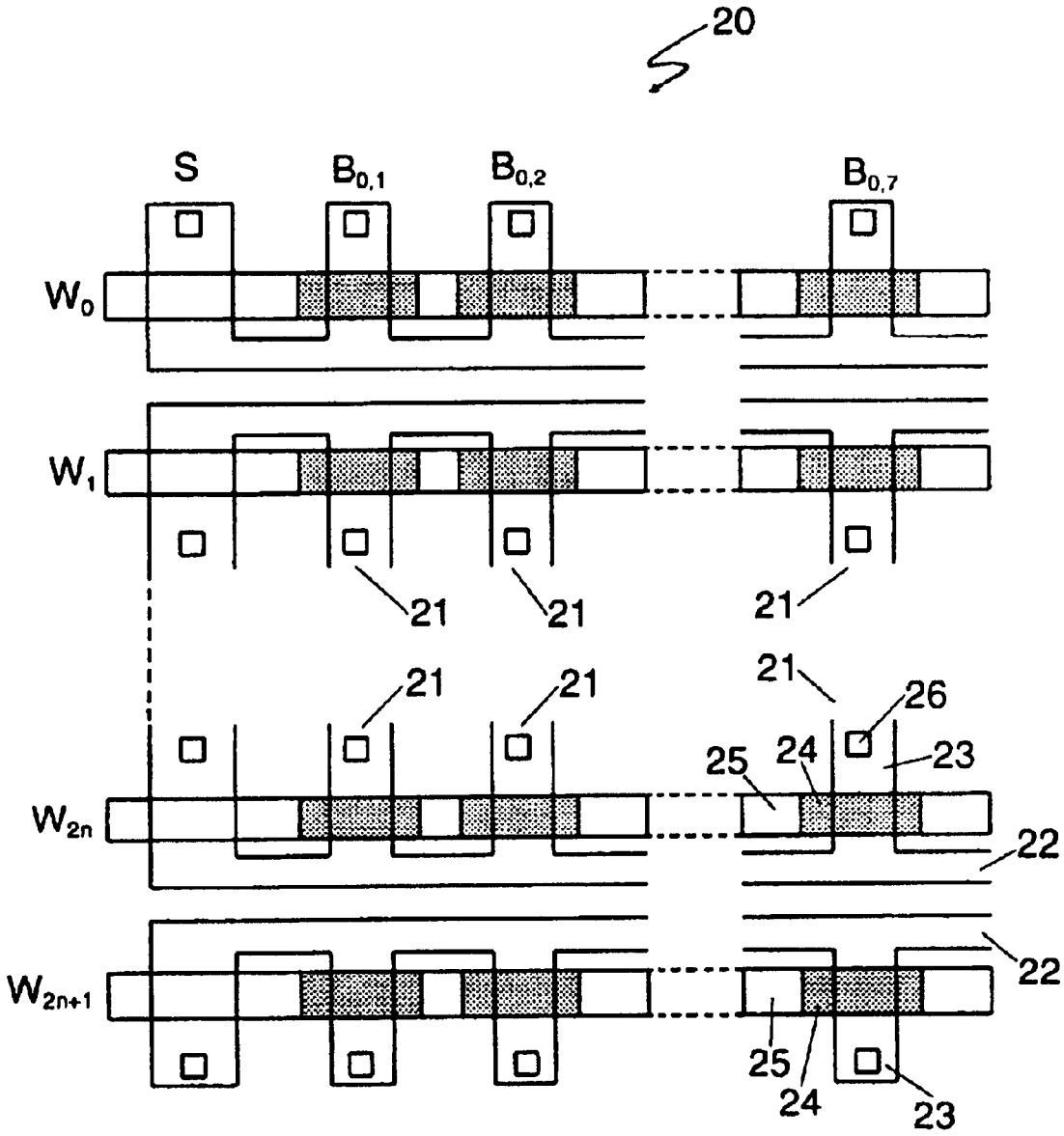
FIG. 2 is a diagram showing an illustrative layout for the array of FIG. 1.

FIG. 2 is an illustrative layout of the memory array of the nonvolatile memory cell array 10 of FIG. 1. In the present invention, the nonvolatile memory cell array 20 of FIG. 2, is made of NMOS single transistor memory cells or nonvolatile memory transistors 21. These memory cells are similar to the ETOX cell developed by Intel. Each nonvolatile memory transistor 21, has a source 22, a drain 23, a floating gate 24, and a control gate 25.

Wordlines $W_0$, $W_1$, . . . $W_{2n}$, $W_{2n+1}$ are used to select half of a given row of nonvolatile memory transistors 21 of the nonvolatile memory cell array 20. Each of the wordlines $W_0$, $W_1$, . . . $W_{2n}$, $W_{2n+1}$ activates a row of control gates 25.

Bitlines, $B_{0,0}$, $B_{0,1}$ . . . $B_{0,7}$ are used to select of a given column of nonvolatile memory transistors 21 of the nonvolatile memory cell array 20. Each of the bitlines, $B_{0,0}$, $B_{0,1}$ . . . $B_{0,7}$ connected to a column of drains 23 via the contact 26.

Source S is used to select the N+ source diffusion common to each row of nonvolatile memory transistors 21. This is different from a typical ETOX array where the sources of two adjacent rows of transistors are merged.

The floating gate 24 of the array nonvolatile memory transistors 21 in nonvolatile memory cell array 20 is the memory cell. The erasure, programming and reading of the floating gate 24 of the nonvolatile memory transistors 21 in nonvolatile memory cell array 20 is the memory cell voltages as indicated in Table 1. The values of the voltages indicated in Table 1 are typical of the type of cell, but they may vary depending on the process technology and the geometry of the cell.

The nonvolatile memory cell array 10 shown in FIG. 1, is a stacked P-well selected single nonvolatile memory cell addressable array. Additional columns of source select transistors $T_0$, $T_1$, . . . $T_{2n}$, $T_{2n+1}$ can be introduced in the array in order to keep the resistance of the source diffusion within acceptable limits creating a group of well contained memory bytes 19. Multiple columns of source selection transistors will require separate addressing not depicted but well known in the art.

The voltage $V_{ss}$ shown as the bottom rail, indicates the lowest voltage supplied externally and in the following is considered equal to the group potential. $V_{cc}$ indicates the operating voltage of the circuit.

The N+ source diffusion is common to each row of nonvolatile memory transistors 11. This is different from a typical prior-art ETOX array where the sources of two adjacent rows of transistors are merged. The source of each row 12 is connected to the drain 12 of the source select transistors $T_0$, $T_1$, . . . $T_{2n}$, $T_{2n+1}$. The gate of the source select transistors $T_0$, $T_1$, . . . $T_{2n}$, $T_{2n+1}$ of one row is the same as the wordline $W_0$, $W_1$, . . . $W_{2n}$, $W_{2n+1}$ of the row.

The novel nonvolatile memory cell array 10 configuration described substantially eliminates the current leakage and drain turn-on problem, and the memory transistors can be programmed or erased without restriction on the threshold voltage or the drain coupling ratio. The memory transistor can be set to operate as a depletion device. This improves the cell read current for a given set of biasing condition during read, as compared to the case where the memory cell cannot be set to operate as a depletion device. This translates into a reduced read access time, or, for a given cell current, it allows the use of a lower power supply voltage.

It will be shown that such novel array configuration can use either NMOS or PMOS memory cells, of the stacked or split gate type, using well proven mechanisms for programming or erasing the cells.

The operation of the array described with reference to FIGS. 1 and 2 is summarized in Table 1.

TABLE 1

| Terminals | Program $c^-$ to FG, cell off | Erase $c^-$ to P-well, cell on | Read |
|---|---|---|---|
| $W_0$ | +9 | −9 | Vcc |
| $W_1$ | 0 | 0 | 0 |
| $W_{2n}$ | 0 | 0 | 0 |
| $W_{2n+1}$ | 0 | 0 | 0 |
| $B_0$ | +6 | float | Vread |
| $B_1$ | 0 | float | 0 |
| $B_7$ | 0 | float | 0 |
| S | 0 | float | 0 |
| $V_{gpw0}$ | Vcc | 0 | Vcc |
| $V_{gpw1---}$ | Vcc | Vcc | Vcc |
| $V_{pw}$ | 0 | +7 | 0 |

In Table 1 it is assumed that the cell with bitline $B_0$ and wordline $W_0$ (cell 0,0) is programmed or erased.

In this array, erase is the nonselective operation since all the cells of one byte 19 (byte erase) or on the entire selected row (sector erase) are erased. It is also assumed, as it is customarily done in Flash or EEPROM arrays with NMOS memory cells, that the programming operation is always preceded by the erase operation.

Erasing the nonvolatile memory cell (removal of electrons from the floating gate) occurs as a result of Fowler-Nordheim (FN) tunneling of electrons from the floating gate 14 in FIG. 1 and 24 in FIG. 2 to the P-well $PW_0$, $PW_1$, . . . $PW_n$. This type of erase is usually called uniform channel erase and is preferred to the other two mechanism which have been used, source erase or negative gate source erase. These other erase mechanisms create a significant band-to-band tunneling current. Band-to-band tunneling current has two deleterious effects; it increases the amount of current needed for erasing the byte/sector 19, and it also may create retention problems caused by injection of hot holes into the floating gate. Channel erase can be used in this array because a floating P-Well $PW_0$, $PW_1$, . . . $PW_n$ is used which can be biased positively respect to ground. This well configuration is often called Triple Well.

With the conditions set forth in Table 1, only the first byte of the row is erased (for byte erase) since the P-Wells $PW_0$, $PW_1$, . . . $PW_n$ of all the other bytes on the same row are at ground potential and the voltage between the floating gate 14 in FIG. 1 and 24 in FIG. 2, and the channel (9 V * the cell coupling ratio) is not enough for generating any significant amount of FN tunneling current.

Channel Hot Electrons (CHE) injected into the floating gate 14 in FIG. 1 and 24 in FIG. 2 using the conditions outlined in Table 1 selectively programs the nonvolatile memory cell. The threshold is raised to a positive value safely above $V_{cc}$. This is the mechanism extensively used for EPROM and Flash memories. As previously mentioned, there is no current contribution from the non-selected nonvolatile memory cells on the same bitline $B_{0,0}$, $B_{0,1}$, . . . $B_{0,7}$ during programming because the sources of these nonvolatile memory cells are floating.

Reading of the nonvolatile memory cell is performed under the conditions defined in Table 1. The source select transistor $T_0$, $T_1$, . . . $T_{2n}$, $T_{2n+1}$, which is a NMOS transistor designed to be an enhancement type, is turned on, bringing the voltage of the common source of the cells of that row to a potential close to ground.

As previously noted, when compared with traditional common source arrays, the array configuration of FIGS. 1 and 2 has the advantage that the erased threshold can be set to a convenient negative value, since, during reading of the selected cell, the other nonvolatile memory cells connected to the selected bitline $B_{0,0}$, $B_{0,1}$, . . . $B_{0,7}$, irrespective of their state, cannot contribute any current because their sources are floating.

The penalty for using this cell as compared to the other arrays is a small increase of the vertical dimension of the nonvolatile memory cell, as it will be shown later.

The worst-case maximum voltage that the memory transistor has to sustain is +6 V on the drain side 13 in FIG. 1 and 23 in FIG. 2 with the wordline $W_0$, $W_1$, . . . $W_{2n}$, $W_{2n+1}$ grounded (unselected nonvolatile memory cells on the selected bitline $B_{0,0}$, $B_{0,1}$, . . . $B_{0,7}$). The source select transistor $T_0$, $T_1$, . . . $T_{2n}$, $T_{2n+1}$ has to be able to sustain reliably +/−9 V between the gate and the source, drain and body terminals. For good reliability the maximum field across the gate oxide has to be kept below 6 mV/cm, which requires a gate oxide thickness of ~150 A. The voltage on the junctions of these transistors is limited to 6 V.

The well-select CMOS transistors 18 have to sustain +7 V between any terminals. Therefore, in addition to the memory device, enhancement type CMOS devices with ~150 A gate oxide need to be available for the source select transistor $T_0$, $T_1$, . . . $T_{2n}$, $T_{2n+1}$ and for switching the P-wells $PW_0$, $PW_1$, . . . $PW_n$. The voltages, which the junctions have to sustain, are below 10 V and these sustaining voltages can be obtained with the junction usually formed for making logic CMOS devices down to 0.25 um technologies.

The process flow outlined below assumes that the nonvolatile memory cell array and the peripheral circuits are embedded in a digital product made with a conventional CMOS process used for digital products (hereinafter the "Logic Process"), to which the process steps required by the nonvolatile memory cell transistors and the high voltage devices are added.

For the present discussion, it is assumed that the Logic Process employs the so-called retrograde well approach as first introduced in the 0.35 um technology node and bulk P-type starting material is used. When retrograde wells are used, it is very difficult to use the logic retrograde wells for the nonvolatile devices because of the different requirements for threshold voltages and maintaining voltages. It is therefore assumed that the logic wells and the wells used for the nonvolatile memory cell devices are different.

Under these assumptions the Logic Process and the added steps are shown below.

| Logic Process Stop | Added Step |
|---|---|
| Oxide Isolation | Deep N-Well formation (Mask #1)<br>High Voltage P-Well formation (Mask #2)<br>Tunnel oxidation (90-100 A)<br>Floating Gate deposition and doping<br>ONO formation<br>Floating Gate patterning (Mask #3)<br>High Voltage Gate oxidation (adjusted for a final thickness after Logic Gate oxidation of (~150 A) |
| Logic P-Well formation | |
| Logic N-Well formation | Selective removal of High Voltage Gate oxide (Mask #4) |
| Logic Gate oxidation | |
| Logic Gate deposition | |
| Logic Gate patterning | Stacked Gate patterning and etch (Mask #5) |
| Continue Logic Process steps | |

As can be seen from the above process summary, only 5 masking operations are added to the standard Logic Process.

In the array described with reference to FIGS. 1 and 2, only one source select transistors $T_0$, $T_1$, . . . $T_{2n}$, $T_{2n+1}$ per row is used and the memory byte 19 or sector selection is accomplished using CMOS inverter 18 to biases the separate P-Wells $PW_0$, $PW_1$, . . . $PW_n$.

Figure 3:
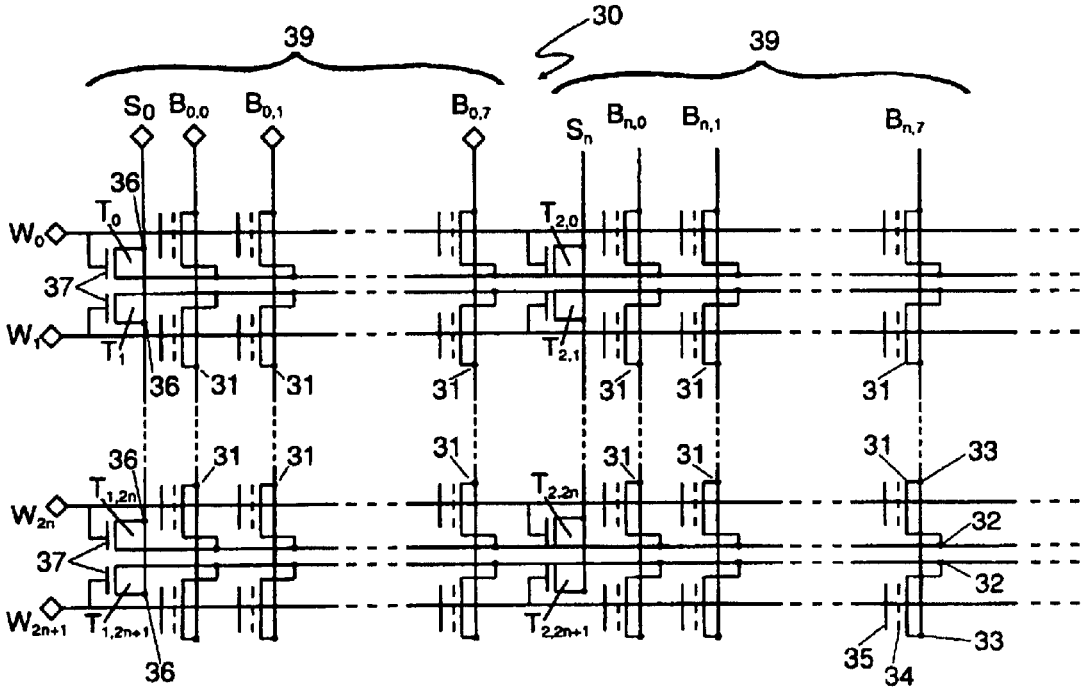
FIG. 3 is an electrical schematic diagram of a second memory array according to the present invention.

Referring to FIG. 1, a memory byte 19 is separated by P-Wells $PW_0$, $PW_1$, . . . $PW_n$ with memory byte 19 selection being accomplished by using a CMOS inverter 18. Referring now to FIG. 3, memory byte 39 selection is accomplished using a multiple of source selection $S_0$, . . . $S_n$ replacing the need for the P-wells $PW_0$, $PW_1$, . . . $PW_n$ of FIG. 1. Accordingly, in a second embodiment, the multiple source selection nonvolatile memory cell array 30 of FIG. 3, is made of nonvolatile memory transistors 31. The multiple of source selection $S_0$ . . . $S_n$ are used for memory byte 39 or sector selection.

With the multiple of source selection $S_0$ . . . $S_n$ used for each memory byte 39 or sector selection, the entire array can be placed on a common well which does not have to be electrically isolated from the substrate.

FIG. 3 is an electrical schematic diagram of the multiple source selection nonvolatile memory cell array 30. Each nonvolatile memory transistors 31, has a source 32, a drain 33, a floating gate 34, and a control gate 35.

Wordlines $W_0$, $W_1$, . . . $W_{2n}$, $W_{2+1}$ are used to select half of a given row of nonvolatile memory transistors 31 of the multiple source selection nonvolatile memory cell array 30. Each of the wordlines $W_0$, $W_1$, . . . $W_{2n}$, $W_{2n+1}$ activates a row of control gates 35.

Bitlines, $B_{0,0}$, $B_{0,1}$ . . . $B_{0,7}$ are used to select of a given column of nonvolatile memory transistors 31 of the multiple source selection nonvolatile memory cell array 30. Each of the bitlines, $B_{0,0}$, $B_{0,1}$ . . . $B_{0,7}$ connected to a column of drains 35.

The multiple of source selection $S_0$ . . . $S_n$, are used to select the N+ source diffusion common to each row of nonvolatile memory transistors 31. This is different from a typical ETOX array where the sources of two adjacent rows of transistors are merged. Each row of nonvolatile memory transistors 31 for each memory byte 39 of the multiple source selection nonvolatile memory cell array 30 has a source select transistors $T_{0,0}$, $T_{0,1}$ . . . $T_{n,0}$, $_{n,2n+1}$ associated with it. The source select transistors $T_{0,0}$, $T_{0,1}$, . . . $T_{n,0}$, $T_{n,2n+1}$ selects the N+ diffusion common for a row of NMOS single transistor memory cells 31 for each memory byte 39. The source select transistors $T_{0,0}$, $T_{0,1}$, . . . , $T_{n,0}$, $T_{n,2n+1}$ source 36, is connect to the multiple source selection $S_0$ . . . $S_n$ and the drain is connect to the row of nonvolatile memory transistor's 31 source 32. Each source select transistors $T_{0,0}$, $T_{0,1}$, . . . $T_{n,0}$, $T_{n,2n+1}$ control gate 37 is activated by the Wordlines $W_0$, $W_1$, . . . $W_{2n}$, $W_{2n+1}$.

Each memory byte 39 of nonvolatile memory transistors 31 of the multiple source selection nonvolatile memory cell array 30 are isolated by the multiple source selection $S_0$ . . . $S_n$.

The floating gate 34 of the array NMOS single transistor memory cells 31 in multiple source selection nonvolatile memory cell array 30 is the memory cell. The erasure, programming and reading of the floating gate 34 of the nonvolatile memory transistors 31 in the multiple source selection nonvolatile memory cell array 30 is the memory cell voltage as indicate in Table 2. The values of the voltages indicated in Table 2 are typical of the type of cell, but they may vary depending on the process technology and the geometry of the cell.

As an example, the floating gate 34 (memory cell 0,0,0 $S_0$, $W_0$, $B_{0,0}$) is programmed when wordline $W_0$ is at +9 volts, with the rest of the wordlines $W_0$ . . . $W_{2n}$, $W_{2n+1}$ at 0 volts and the bitline $B_{0,0}$ is at +6 volts, with the rest of the bitlines $B_{0,0}$, . . . $B_{0,7}$ at 0 volts, multiple source selection $S_0$ is at 0 volts and the rest of the multiple source selection $S_0$ . . . $S_n$float. The floating gate 34 (memory cell 0,0,0) is selectively programmed by Channel Hot Electrons (CHE) injected into the floating gate 34 (memory cell 0,0,0) using the conditions mentioned above and the threshold is raised to a positive value safely above $V_{cc}$.

Figure 4:
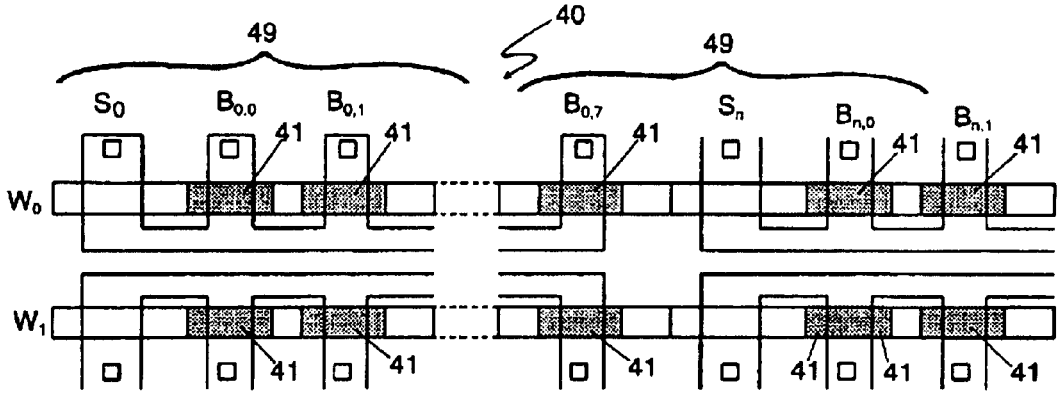
FIG. 4 is a diagram showing an illustrative layout for the array of FIG. 3.

FIG. 4 is an illustrative layout of the multiple source selection nonvolatile memory cell array 40 of FIG. 3. In a second embodiment of the present invention, the multiple source selection nonvolatile memory cell array 40 of FIG. 4, is made of NMOS single transistor memory cells 41. The circuit of FIG. 4 is similar to circuit of FIG. 2 with the differences note below.

The multiple of source selection $S_0$ . . . $S_n$, are used to select the N+ source diffusion common to each row of NMOS single transistor memory cells 41. This is different from a typical ETOX array where the sources of two adjacent rows of transistors are merged. Each row of NMOS single transistor memory cells 41 for each memory byte 49 of the multiple source selection nonvolatile memory cell array 40 has a source select transistors $T_{0,0}$, . . . $T_{0,1}$, $T_{n,0}$, $T_{n,2+1}$, associated with it. The source select transistors $T_{0,0}$, $T_{0,1}$, . . . $T_{n,0}$, $T_{n,2n+1}$ selects the N+ diffusion common for a row of NMOS single transistor memory cells 41 for each memory byte 49.

Each memory byte 49 of nonvolatile memory transistors 41 of the multiple source selection nonvolatile memory cell array 40 are isolated by the multiple source selection $S_0$ . . . $S_n$.

The novel multiple source selection nonvolatile memory cell array 40 configuration described herein substantially eliminates the current leakage and drain turn-on problem, and the memory transistors can be programmed or erased without restrictions on the threshold voltage or the drain coupling ratio. The memory transistor can be set to operate as a depletion device. This improves the cell read current for a given set of biasing condition during read, as compared to the case where the memory cell cannot be set to operate as a depletion device. This translates into a reduced read access time and/or for a given cell current, it allows the use of a lower power supply voltage.

It will be shown that such novel array configuration can use either NMOS or PMOS memory cells, of the stacked or split gate type, using well proven mechanisms for programming or erasing the cells.

The operation of the array described with reference to FIGS. 1 and 2 is summarized in Table 2.

The operation of the array of FIGS. 3 and 4 is summarized in Table. 2.

TABLE 2

| Terminals | Program $c^-$ to FG, cell off | Erase $c^-$ to P-well, cell on | Read |
|---|---|---|---|
| $W_0$ | +9 | Vt+ | Vcc |
| $W_1$ | 0 | 0 | 0 |
| $W_{2n}$ | 0 | 0 | 0 |
| $W_{2n+1}$ | 0 | 0 | 0 |
| $B_{0,0}$ | +6 | float | Vread |
| $B_{0,1}$ | 0 | float | 0 |
| $B_{0,7}$ | 0 | float | 0 |
| $S_0$ | 0 | 12 | 0 |
| $S_n$ | float | float | 0 |

In Table 2 it is assumed that the cell with source $S_0$, bitline $B_{0,0}$ and wordline $W_0$ (cell 0,0,0) is read, programmed or erased. The values of the voltages indicated in Table 2 are typical for this type of cell, but they may vary depending on the process technology and the geometry of the cell.

In this array, erase is the non-selective operation since all the cells of one byte (byte erase) or on the entire selected row (sector erase) are erased. It is also assumed, as it is customary in Flash or EEPROM arrays with NMOS memory cells, that the programming operation is always preceded by the erase operation.

Erase of the cell (removal of electrons from the floating gate 34) occurs as a result of FN tunneling from the floating gate to the source. This type of erase is done using the so-called grounded gate source erase mechanism, which has been widely used for Flash memories. $V_{s+}$ indicates a voltage slightly above the threshold of the source select transistor. This type of erase has several drawbacks, as mentioned before. In addition a dedicated source junction has to be fabricated which complicates the process.

With the conditions of Table 2, only the first byte of the row is erased (byte erase) since the sources of all the other bytes are floating. The cell is selectively programmed by CHE as before.

Reading of the cell is done under the conditions defined in Table 2. Again it is clear that no leakage current problem exist during reading because the source select transistor of the mirrored cell is off. As a result the erased threshold of this cell can be set negative.

The array described with reference to FIGS. 3 and 4 does not require isolated P-Wells, which simplifies the process. Due to the lack of a P-well for the source junctions as in FIG. 1, a specially designed source junction is used. The junction is a grounded gate source array mechanism as well known in the art and is an IEEE standard.

In addition, the use of the grounded gate source erase mechanism increases the current required. The sustaining voltage requirement for the junction is also higher (12 V vs. 9 V).

Figure 5:
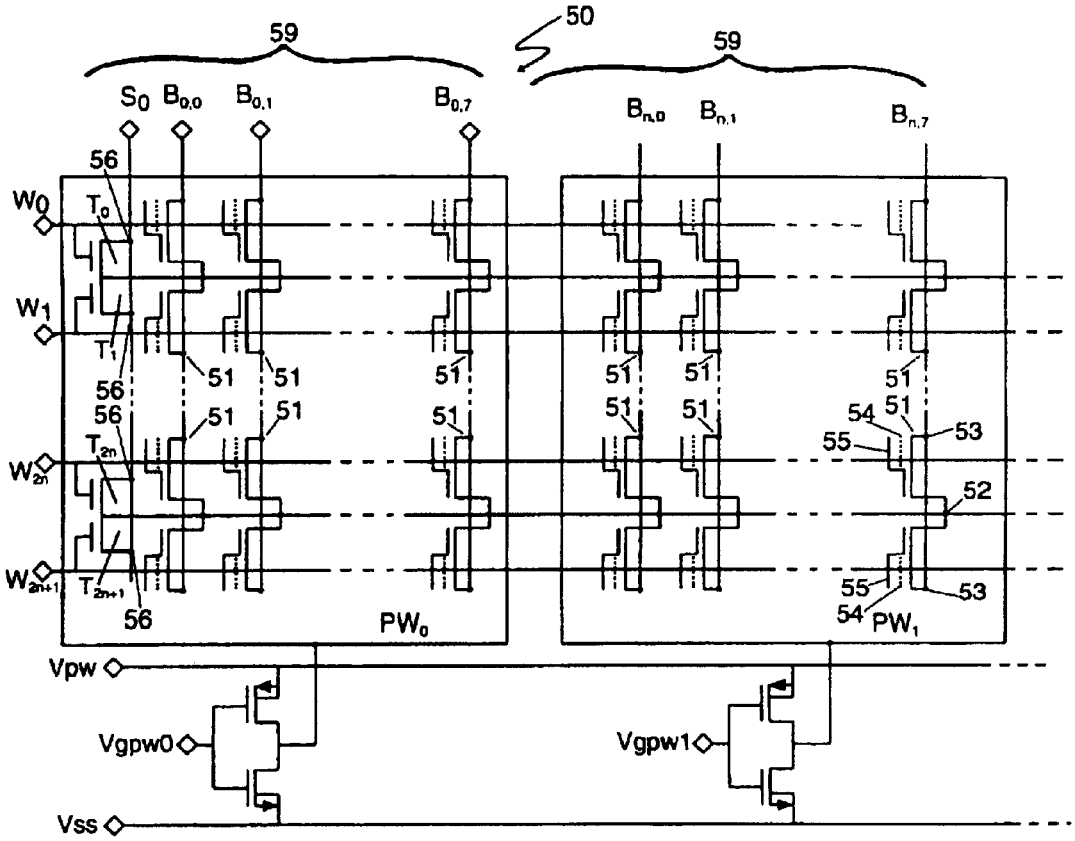
FIG. 5 is an electrical schematic diagram of an array employing a split gate cell.

A third embodiment of the present invention is shown in FIG. 5, the electrical schematic diagram of a split gate nonvolatile memory cell array 50. The split gate nonvolatile memory cell array 50 circuit depicted in FIG. 5 is similar to the nonvolatile memory cell array 10 circuit depicted in FIG. 1 with the differences note below.

Split gate nonvolatile memory cell array 50 is made of split gate nonvolatile memory transistors 51. Each split gate nonvolatile memory transistor 51, has a source 52, a drain 53, a floating gate 54, and a control gate 55.

Wordlines $W_0$, $W_1$, . . . $W_{2n}$, $W_{2n+1}$ overlap the floating gate 54 on two sides or one side only (as shown later in FIG. 8c, split gate memory cell layout). In the split gate nonvolatile memory transistor 51 the operation of the wordline over the diffusion area is called the memory select 69 or FIG. 6. Each of the wordlines $W_0$, $W_1$ . . . $W_{2n}$, $W_{2n+1}$ activates a row of control gates 55.

Source, S is used to select the N+ source diffusion common to each row of split gate nonvolatile memory transistor 51. Each row of split gate nonvolatile memory transistor 51 of the split nonvolatile memory cell array 50 has a source select transistors $T_0$, $T_1$, . . . $T_{2n}$, $T_{2n+1}$, associated with it. The source select transistors $T_0$, $T_1$, . . . $T_{2n}$, $T_{2n+1}$ selects the N+ diffusion common for a row of split gate nonvolatile memory transistor 51. The source select transistors $T_2$, $T_1$, . . . $T_{2n}$, $T_{2+1}$ source 56, is connect to the source S and the drain is connect to both mirrored rows of split gate nonvolatile memory transistors 51 source 52. Each source select transistors $T_0$, $T_1$, . . . $T_{2n}$, $T_{2n+1}$ control gate 57 is activated by the wordlines $W_0$, $W_1$, . . . $W_{2n}$, $W_{2n+1}$.

The N+ source diffusion is now shared by two rows of mirrored split gate nonvolatile memory transistors 51 and is connected to one side of the source select transistors $T_0$, $T_1$, . . . $T_{2n}$, $T_{2n+1}$. This saving in cell height is compensated by the need to have a wider wordline on the memory cell.

The definition of the wordlines of the memory cells can be done with the patterning step of the logic gates and the complex patterning step of the stacked gate is avoided.

The floating gate 54 of the array split gate nonvolatile memory transistor 51 in split gate nonvolatile memory cell array 50 is the memory cell. The erasure, programming and reading of the floating gate 54 of the split gate nonvolatile memory transistor 51 in split gate nonvolatile memory cell array 50 is the memory cell voltages as indicate in Table 3. The values of the voltages indicated in Table 3 are typical of the type of cell, but they may vary depending on the process technology and the geometry of the cell. As an example, the floating gate 54 (memory cell 0,0) is programmed when wordline $W_0$ is at +9 volts, with the rest of the wordlines $W_1$, . . . $W_{2n}$, $W_{2+1}$ at 0 volts and the bitline $B_0$ is at +6 volts, with the rest of the bitlines $B_{0,0}$, $B_{0,1}$ . . . $B_{0,7}$ at 0 volts, Source is at 0 volts, $V_{gpw0\text{-}n}$ at Vcc and $V_{pw}$ at 0 volts. The floating gate 54 (memory cell 0,0) is selectively programmed by Channel Hot Electrons (CHE) injected into the floating gate 54 (memory cell 0,0) using the conditions mentioned above and the threshold is raised to a positive value safely above Vcc.

Figure 6:
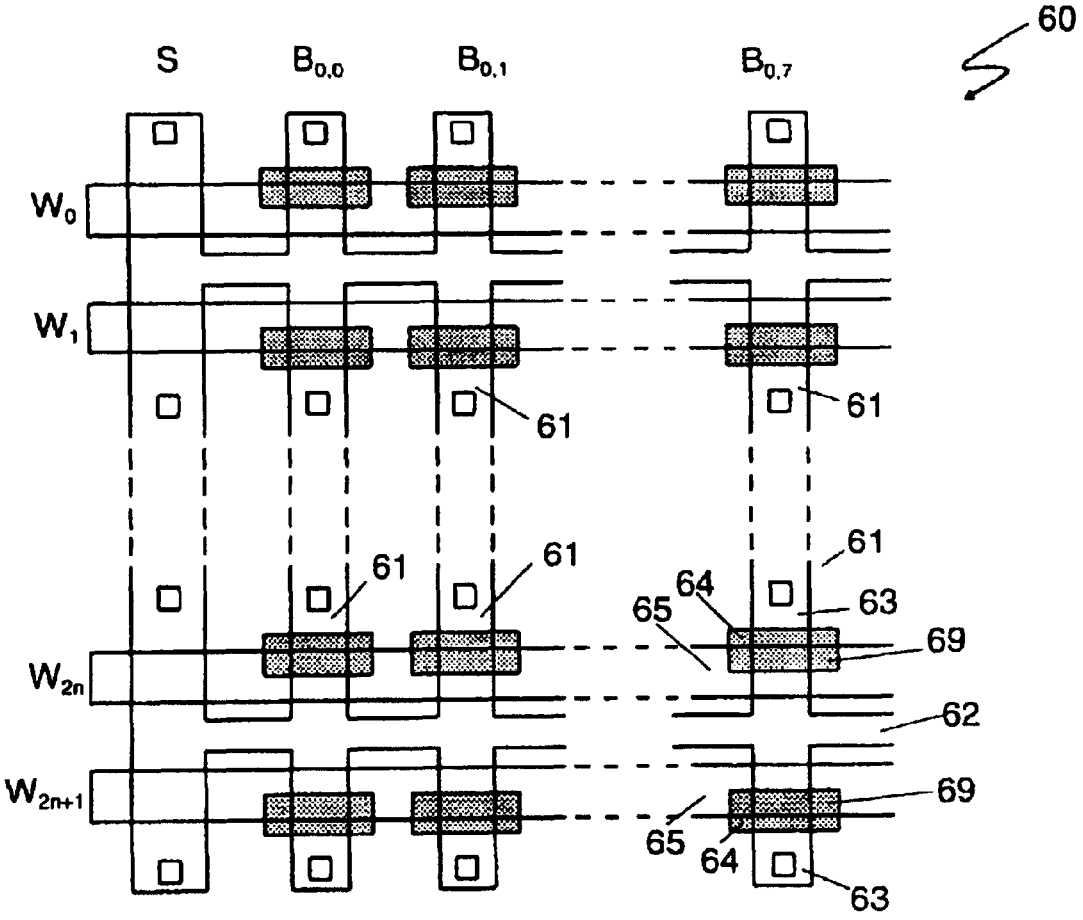
FIG. 6 is a diagram showing an illustrative layout for the array of FIG. 5.

FIG. 6 is an illustrative layout of the memory array of the split gate nonvolatile memory cell array 50 of FIG. 5. In a third embodiment of the present invention, the split gate nonvolatile memory cell array 60 of FIG. 6, is made of split gate NMOS single transistor memory cells or split gate nonvolatile memory transistors 61. The split gate nonvolatile memory cell array 60 circuit depicted in FIG. 6 is similar to the nonvolatile memory cell array 20 circuit depicted in FIG. 2 with the differences note below.

The split gate nonvolatile memory cell array 60 is made of split gate nonvolatile memory transistors 61. Each split gate nonvolatile memory transistor 61, has a source 62, a drain 63, a floating gate 64, and a control gate 65.

Wordlines $W_0$, $W_1$, . . . $W_{2n}$, $W_{2n+1}$ overlap the floating gate 64 on two sides or one side only (as shown later in FIG. 8c, split gate memory cell layout). In the split gate nonvolatile memory transistor 61 the portion of the wordline over the diffusion area is called the memory select 69. Each of the wordlines $W_0$, $W_1$, . . . $W_{2n}$, $W_{2n+1}$, activates a row of control gates 65.

The N+ source diffusion is now shared by two rows of mirrored split gate nonvolatile memory transistor 61 and is connected to one side of the source 62. This saving in cell height is compensated by the need to have a wider wordline on the memory cell.

The definition of the wordlines of the memory cells can be done with the patterning step of the logic gates and the complex patterning step of the stacked gate is avoided.

Since negative bias is needed for erasure, a triple well process is used.

The floating gate 64 of the array of split gate nonvolatile memory transistors 61 in split gate nonvolatile memory cell array 60 is the memory cell. The erasure, programming and reading of the floating gate 64 of the split gate nonvolatile memory transistors 61 in split gate nonvolatile memory cell array 60 is the memory cell voltages as indicate in Table 3.

The novel split gate nonvolatile memory cell array 60 configuration described completely eliminates the current leakage problem and the drain turn-on problem and the memory transistors can be programmed or erased without restrictions on the threshold voltage or the drain coupling ratio. The memory transistor can be set to operate as a depletion device. This improves the cell read current for a given set of biasing condition during read, as compared to the case where the memory cell cannot be set to operate as a depletion device. This translates into a reduced read access time, or, for a given cell current, it allows the use of a lower power supply voltage.

It will be shown that such novel array configuration can use either NMOS or PMOS memory cells, of the split gate type, using well-proven mechanisms for programming or erasing the cells.

The operation of the array is summarized in Table. 3

TABLE 3

| Terminals | Program $c^-$ to FG, cell off | Erase $c^-$ to P-well, cell on | Read |
|---|---|---|---|
| $W_0$ | +9 | −9 | Vcc |
| $W_1$ | 0 | 0 | 0 |
| $W_{2n}$ | 0 | 0 | 0 |
| $W_{2n+1}$ | 0 | 0 | 0 |
| $B_0$ | +6 | float | Vread |
| $B_1$ | 0 | float | 0 |
| $B_7$ | 0 | float | 0 |
| S | 0 | float | 0 |
| $V_{gpw0}$ | Vcc | 0 | Vcc |
| $V_{gpw1---}$ | Vcc | Vcc | Vcc |
| $V_{pw}$ | 0 | +7 | 0 |

In Table 3 it is assumed that the cell with bitline $B_{0,0}$, and wordline $W_0$ (cell 0,0 is programmed or erased. The values of the voltages indicated in Table 3 are typical for this type of cell, but they may vary depending on the process technology and the geometry of the cell.

In this array, erase is the non-selective operation since all the cells of one byte (byte erase) or on the entire selected row (sector erase) are erased. It is also assumed, as it is customarily done in Flash or EEPROM arrays with NMOS memory cells, that the programming operation is always preceded by the erase operation.

Erase of the cell (removal of electrons from the floating gate 54) is assumed to occur as a result of FN tunneling from the floating gate 54 to the P-well $PW_0$, $PW_1$, . . . $PW_n$ as for the split gate array.

With the conditions of Table 3 both the source S and split gate nonvolatile memory transistors 51 in FIG. 5 and 61 in FIG. 6 are turned off and the selected P-well $PW_0$, $PW_1$, . . . $PW_n$ is accumulated. Only the first byte of the row is erased (byte erase) since the P-wells $PW_0$, $PW_1$, . . . $PW_n$ of all the other bytes on the same row are at ground potential and the voltage between the floating gate 54 in FIG. 5 and 64 in FIG. 6 and the channel (9 V * the cell coupling ratio) is not enough for generating any significant amount of FN tunneling current.

The cell is selectively programmed using CHE injected into the floating gate 54 in FIG. 5 and 64 in FIG. 6 using the conditions of Table 3, and the threshold is raised to a positive value safely above Vcc. This is the same mechanism used in the stacked gate cell.

Reading of the cell is done under the conditions defined in Table 3. The source select transistor $T_0$, $T_1$, . . . $T_{2n}$, $T_{2n+1}$, which is a NMOS transistor designed to be an enhancement type, is turned on bringing the voltage of the common source of the cells of that row close to ground.

As for the split gate array, the erased threshold can be set to a convenient negative value, since, during reading of the selected cell, the other cells connected to the selected bitline $B_{0,0}$, $B_{0,1}$, . . . $B_{0,7}$, irrespective of their state, cannot contribute any current because their sources are floating.

The high voltage requirements for the array of this embodiment are the same as for the stacked gate cell array, with one major difference. During erase the memory select transistor has 16 V across its gate and for reliability reason an oxide thickness of at least 250 A has to be used. The source select transistor $T_0$, $T_1$, . . . $T_{2n}$, $T_{2n+1}$ has to be able to sustain reliably only 6 V on the junction with the gate grounded.

For process simplicity, the gate oxide thickness of the source S and split gate nonvolatile memory transistors 51 in FIG. 5 and 61 in FIG. 6 may be the same (250 A for the voltages used). The stacked gate array described before uses a much thinner gate oxide on the source select transistor $T_0$, $T_1$, . . . $T_{2n}$, $T_{2n+1}$ and the peripheral high voltage transistors. In this respect it is expected that a larger read current can be obtained on the stacked gate array as compared to the split cell. The main limitation is caused by the presence of the memory select transistors and its relatively thick gate oxide.

The main advantage of using the cell of split gate nonvolatile memory transistors 51 in FIG. 5 and 61 in FIG. 6 is the elimination of the stacked gate patterning step in the process, since the same mask and etch used for defining the logic gates can be used to define the memory wordlines. If a lower cell read current can be tolerated, it is easier to integrate these memory arrays into logic CMOS process.

According to another illustrative embodiment of the invention, an array of memory cells uses PMOS memory cells. The electrical schematic diagram of the array is the same as shown in FIG. 1 and the layout as in FIG. 2, but the memory cells are stacked gate PMOS cell and are built on isolated N-Wells instead of P-Wells. The source select transistors are PMOS devices.

The operation of the array is summarized in Table. 4.

TABLE 4

| Terminals | Program $c^-$ to FG, cell on | Erase $c^-$ to N-well, cell off | Read |
|---|---|---|---|
| $W_0$ | Vgp | −8 | Vss |
| $W_1$ | +6 | +8 | Vcc |
| $W_{2n}$ | +6 | +8 | Vcc |
| $W_{2n+1}$ | +6 | +8 | Vcc |
| $B_0$ | 0 | float | Vread |
| $B_1$ | float | float | 0 |
| $B_7$ | float | float | 0 |
| S | +6 | float | Vcc |
| $V_{gpw0}$ | 0 | 0 | Vss |
| $V_{gpw1---}$ | Vcc | Vcc | Vcc |
| $V_{pw}$ | +6 | +8 | Vcc |

In Table 4, it is assumed that the cell with bitline $B_{0,0}$ and wordline $w_0$ (cell 0,0) is programmed or erased. The values of the voltages indicated in Table 4 are typical for this type of cell, but they may vary depending on the process technology and the geometry of the cell.

In a PMOS array programming of the cell (injection of electrons into the floating gate) lowers the threshold of the cell as compared with the value of a cell after UV erase (no charges on the floating gate) and the cell become more conductive.

Erasing increases the threshold setting the cell off during the read operation. In this array the erase is the non-selective operation (all the cells of one row or of one byte are simultaneously erased). Programming is the selective operation (only one cell is programmed). The proposed mechanisms for programming and erasing are well known in the art.

It is also assumed, as it is customarily done in Flash or EEPROM arrays with PMOS memory cells, that the programming operation is always preceded by the erase operation.

Erase occurs by FN tunneling of electrons from the floating gate under the selected row to the channel (channel erase). Under the bias conditions of Table 4 the channels of the memory gates under the selected row are inverted and at the same potential of the N-well. If byte erase is desired, the wordlines of the non-selected bytes are either at −8 or 8 V and the non-selected wells are grounded. For these bytes the voltage available between the floating gate and the channel (8 V * the coupling ratio to the channel) is too low for FN tunneling.

Programming of the cell (injection of electrons into the floating gate) occurs as a result of hot electrons injection into the floating gate generated by impact ionization of holes moving from the source to the drain. $V_{gp}$ indicates a voltage usually comprised between 0 and 3 V. It is tuned for maximum electron injection efficiency and is process dependent. Although the cell to be programmed is initially in a non-conductive state, it has been shown that efficient electron injection occurs if the source-drain bias is above the punch-through voltage of the cell, which is dependent on the channel length of the memory transistor.

The cell can be programmed to a normally on state since during the read operation the non selected bitlines $B_{0,0}$, $B_{0,1}$, . . . $B_{0,7}$ of the selected byte are at the same potential of the source S and the sources of the non selected rows are floating (source select transistor is turned off). This is the same as for the NMOS array.

During programming, the worst-case maximum voltage that the memory transistor has to sustain between source and drain is 6 V with Vgs=Vgp for the selected cells. During erase there are no high voltages on the memory junctions.

The source select transistor has to be able to sustain reliably +/−8 V between the gate and the source, drain and body terminals. For the reason stated before, a gate oxide thickness of ~130 A is adequate. The well select CMOS transistors have to sustain +8 V between any terminals. In addition to the memory device, enhancement type CMOS devices with ~130 A gate oxide need to be available. The high voltage requirements for this array are very low and within the capabilities of the logic source drain diffusions down to 0.18 um level of scaling.

The process flow described herein for fabricating the NMOS cells can be used for fabricating the arrays with the PMOS cells. The Deep N-well step can in principle be omitted, but the designs of the peripheral circuits which use negative bias usually requires a P-well, which can go negative below ground. Using the logic N-well for isolating the P-well is quite a difficult task.

Therefore, also in this case these arrays can be fabricated using a standard Logic Process with the addition of 5 masking operations describe before.

The same array configuration described in FIGS. 3 and 4 can be used by replacing the stacked NMOS memory cell with the PMOS cell and by switching the polarity of the wells.

As before it is assumed that a source select transistor is used on each byte.

TABLE 5

| Terminals | Program $c^-$ to FG, cell on | Erase $c^-$ to N-well, cell off | Read |
|---|---|---|---|
| $W_0$ | +3 | −8 | Vss |
| $W_1$ | +6 | +8 | Vcc |
| $W_{2n}$ | +6 | +8 | Vcc |
| $W_{2n+1}$ | +6 | +8 | Vcc |
| $B_{0,0}$ | 0 | float | Vread |
| $B_{0,1}$ | float | float | 0 |
| $B_{0,7}$ | float | float | 0 |
| $S_0$ | +6 | +8 | Vcc |
| $S_n$ | 0 | 0 | 0 |

Erase occurs by FN tunneling of electrons from the floating gate under the selected row to the channel (channel erase). Under the bias conditions of Table 6 the channels of the memory gates under the selected row are inverted and at the same potential of the N-well. Only the sources of memory cell, source $S_0$, bitline $B_{0,0}$ and wordline $W_0$ (cell 0,0,0) are at 8 V. It can be easily seen that the sources of all the other bytes are floating either because the source select transistors are turned off or the source lines are floating. The values of the voltages indicated in Table 5 are typical for this type of cell, but they may vary depending on the process technology and the geometry of the cell.

Programming of the cell (injection of electrons into the floating gate) occurs as a result of hot electrons injection into the floating gate generated by impact ionization of holes moving from the source to the drain as for the stacked gate PMOS array described before.

High voltage requirements are the same as for the stacked gate PMOS array and also the process complexity is the same.

The electrical schematic diagram of the array is the same as shown in FIG. 5 and the layout as in FIG. 6, but split gate PMOS cells, built on isolated N-Wells instead of P-Wells, are used. The source select transistors are PMOS devices.

The operation of the array is summarized in Table 6.

TABLE 6

| Terminals | Program $c^-$ to FG, cell on | Erase $c^-$ to N-well, cell off | Read |
|---|---|---|---|
| $W_0$ | Vgp | −8 | Vss |
| $W_1$ | +6 | +8 | Vcc |
| $W_{2n}$ | +6 | +8 | Vcc |
| $W_{2n+1}$ | +6 | +8 | Vcc |
| $B_0$ | 0 | float | Vread |
| $B_1$ | float | float | 0 |
| $B_7$ | float | float | 0 |
| S | +6 | float | Vcc |
| $V_{gpw0}$ | 0 | 0 | Vss |
| $V_{gpw1---}$ | Vcc | Vcc | Vcc |
| $V_{pw}$ | +6 | +8 | Vcc |

Erasing occurs by FN tunneling of electrons from the floating gate under the selected row to the channel. The values of the voltages indicated in Table 6 are typical for this type of cell, but they may vary depending on the process technology and the geometry of the cell.

Under the bias conditions shown in Table 6, both the source S and memory select transistors under the selected row are turned on and at the same potential of the N-well. If byte erase is desired, the bitlines $B_{0,0}$, $B_{0,1}$, . . . $B_{0,7}$ of the non-selected bytes are at ground potential as the wells. For these bytes the voltage available between the floating gate 54 in FIG. 5 and 64 in FIG. 6 and the channel (8 V * the coupling ratio to the channel) is too low for EN tunneling.

Programming of the cell (injection of electrons into the floating gate 54 in FIG. 5 and 64 in FIG. 6) occurs as a result of hot electrons injection into the floating gate 54 in FIG. 5 and 64 in FIG. 6 generated by impact ionization of holes moving from the source to the drain as for the stacked gate PMOS cell. The source S and memory select transistors under the selected row are turned on and the memory cell is designed to reach punch-through. It is also assumed, as it is customarily done in Flash or EEPROM arrays with PMOS memory cells, that the programming operation is always preceded by the erase operation.

The cell can be programmed to a normally on state since during the read operation, the memory select transistor of the mirrored cell is turned off, the memory cells on the non selected bitlines $B_{0,0}$, $B_{0,1}$, . . . $B_{0,7}$ of the selected byte are at the same potential of the source and the sources of the non-selected rows are floating (source select transistor $T_0$, $T_1$, . . . $T_{2n}$, $T_{2n+1}$ is turned off).

As it was mentioned for the array which uses the NMOS split gate cell, the use of this cell simplify the process, but it has the same problem that the presence of the memory select transistor its relatively thick gate oxide reduces the read current.

The sustaining voltage requirements for the junctions are modest.

Figure 7:
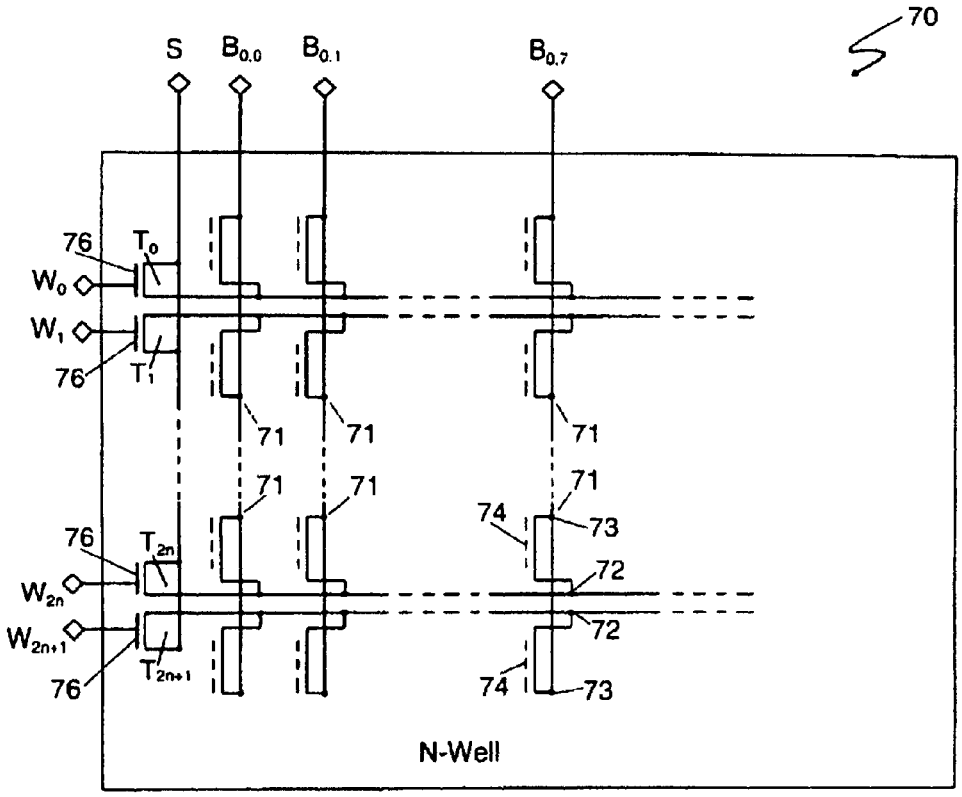
FIG. 7 is an electrical schematic diagram of an illustrative one-time-programmable memory array according to the present invention.

FIG. 7 is an electrical schematic diagram of the memory array of the OTP nonvolatile memory cell array 70. In the present invention, the One Time Programmable (OTP) memory array 70 of FIG. 7, is made of OTP nonvolatile memory transistor 71. The OTP nonvolatile memory cell array 70 circuit depicted in FIG. 7 is similar to the nonvolatile memory cell array 10 circuit depicted in FIG. 1 with the differences note below.

Each OTP nonvolatile memory cell array 70, has a source 72, a drain 73, and a floating gate 74. Note the absence of a control gate as in nonvolatile memory cell array 10 of FIG. 1 control 15. There is no control gate because this is a One Time Programmable nonvolatile memory cell array and the control gate is not needed for erase due to UV erase.

Wordlines $W_0$, $W_1$, . . . $W_{2n}$, $W_{2n+1}$ are used to select half of a given row of OTP nonvolatile memory transistors 71 of the OTP nonvolatile memory cell array 70. Each of the wordlines $W_0$, $W_1$, . . . $W_{2n}$, $W_{2n+1}$ activates a source select transistor $T_0$, $T_1$, . . . $T_{2n}$, $T_{2n+1}$.

OTP nonvolatile memory cell array 70 with configuration described before for the PMOS cell can be used very effectively for an OTP array.

A PMOS nonvolatile memory transistors 71, which can be fabricated in a standard CMOS process without adding new steps, have been proposed using the logic PMOS device with the gate floating 74 as the memory device and the NMOS logic transistor for accessing the memory. The memory cell is programmed to be normally on, erasing can only be done by UV erase. This array can be used for One Time Programmable (OTP) memory functions.

Programming of a cell (0,0 for example) is done by applying for instance 6 V to the N-well and the source S. Also, grounding bitline $B_{0,0}$ and wordline $W_0$ with the source select transistor $T_0$ being turned on.

As explained before for the PMOS array, the channel length of the cell is adjusted so that the memory cell is in punch-through under these conditions and the resultant channel current creates hot electrons which are injected into the floating gate. The PMOS nonvolatile memory transistors 71 use the standard PMOS device of a logic CMOS process with no additional steps added.

This configuration can use either the split nonvolatile memory transistors or stacked gate nonvolatile memory transistors.

Figure 8A:
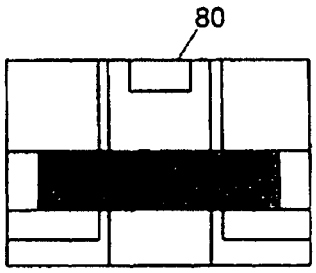
FIG. 8A PRIOR ART
FIGS. 8A through 8C are layout diagrams providing comparisons of memory cells according to the present invention with a prior-art memory cell.

FIG. 8a is a diagram of a prior art memory cell ETOX Cell 80.

Figure 8B:
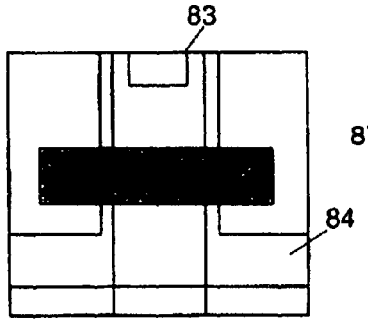

A stacked gate nonvolatile memory transistor 83 is shown in FIG. 8b. The novel aspect of a separate source 84 for each row separated the mirrored nonvolatile memory transistors 11 in FIG. 1.

Figure 8C:
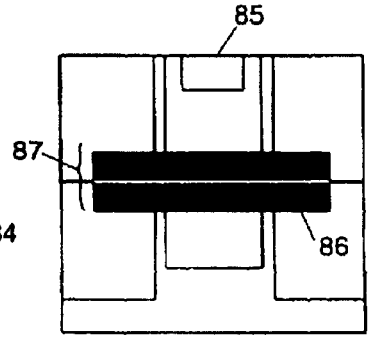

A split gate nonvolatile memory transistor 85 is shown in FIG. 8c. In the split gate nonvolatile memory transistor 85, the portion of the wordline $W_0$, $W_1$, . . . $W_{2n}$, $W_{2+1}$ over the diffusion area is called the memory select gate 86. This memory select gate 86 is some fraction of the total floating gate 87.

Both nonvolatile memory transistors, stacked and split, have the same width of the ETOX cell. The height of the cell with separate source S is increased because of the need of separating the source S of one row from the adjacent one. The height of the split gate width is increased because of the need of adding the select gate.

Using a common set of layout rules typical of a 0.25 um technology, the increase in cell size for both the separate source or split gate cell is around 30%. For the PMOS stacked gate nonvolatile memory transistor cell, the increase is actually less because the deep source junction used in the ETOX cell is not needed and the channel length of the stacked gate nonvolatile memory transistor cell can also be reduced because because of the reduced source to drain bias used for programming of the nonvolatile memory transistor cell.

In addition, the increase in cell area has to be weighted against the amount of area necessary for implementing all the peripheral circuits. For all the arrays described there is no need to control the erased or programmed threshold as needed for the ETOX cell. This reduces the amount of peripheral circuitry used for that function.

The currents required for programming selectively the PMOS nonvolatile memory transistor cells are an order of magnitudes lower than the programming current of the ETOX cell. This reduces the size of the charge pumps.

In general, it can be said that the size of any of the memory arrays, including peripheral circuits, which uses the PMOS or NMOS nonvolatile memory transistor cells, either stacked or split gate, is going to be very close to that of an ETOX array.

While embodiments and applications of this invention have been shown and described, it would be apparent to those skilled in the art that many more modifications than mentioned before are possible without departing from the inventive concepts herein. The invention, therefore, is not to be restricted except in the spirit of the appended claims.

What is claimed is:

1. An array of nonvolatile memory cells arranged in a plurality of rows a plurality of columns comprising:

a substrate upon which said array is deposited;

a wordline plurality of wordlines wherein each of said plurality of wordlines is associated with a one of said plurality of rows in the array;

a plurality of bitlines wherein each of said plurality of bitlines is associated with one of said plurality of columns in the array;

a plurality of nonvolatile memory transistors, each of said nonvolatile memory transistors associated with a one of said plurality of rows and a one of said plurality of columns in the array, each one of said plurality of nonvolatile memory transistors having a source, a drain, a floating gate and a control gate, the control gate of each one of said plurality of nonvolatile memory transistors coupled to the one of said plurality of wordlines of said one of said plurality of rows associated with said one of said plurality of nonvolatile memory transistor, the drain of each one of said plurality of nonvolatile memory transistors coupled to the one of said plurality of bitlines of said one of said plurality of columns associated with said one of said plurality of nonvolatile memory transistors, the source of each one of said plurality of nonvolatile memory being couple to the source of each of said other ones of said plurality of nonvolatile memory transistors in said one of said plurality of rows associated with said one of said plurality of nonvolatile memory transistors;

a plurality of source transistors wherein each one of said plurality of source transistors has a gate coupled to a one of said plurality of wordlines, a source coupled to a source potential line, and a drain coupled to the sources of each of said plurality of nonvolatile memory transistors associated with said one of said plurality of rows associated with said wordline coupled to said source of said one of said plurality of source transistors;

a plurality of isolation well in said substrate wherein a portion of said plurality of nonvolatile memory transistors associated with a byte of data are disposed in each of said plurality of isolation wells; and a plurality of well selection transistors wherein each one of said plurality of well selection transistors is connected to a one of said plurality of isolation wells.

2. An array of nonvolatile memory cells arranged in a plurality of rows and a plurality of columns comprising:

a substrate upon which said array is deposited;

a plurality of wordlines wherein each of said plurality of wordlines is associated with a one of said plurality of rows in the array;

a plurality of bitlines wherein each of said plurality of bitlines is associated with one of said plurality of columns in the array;

a plurality of nonvolatile memory transistors, each of said nonvolatile memory transistors associated with a one of said plurality of rows and a one of said plurality of columns in the array, each one of said plurality of nonvolatile memory transistors having a source, a drain, a floating gate and a control gate, the control gate of each one of said plurality of nonvolatile memory transistors coupled to the one of said plurality of wordlines of said one of said plurality of rows associated with said one of said plurality of nonvolatile memory transistor, the drain of each one of said plurality of nonvolatile memory transistors coupled to the one of said plurality of bitlines of said one of said plurality of columns associated with said one of said plurality of nonvolatile memory transistors, the source of each one of said plurality of nonvolatile memory being couple to the source of each of said other ones of said plurality of nonvolatile memory transistors in said one of said plurality of rows associated with said one of said plurality of nonvolatile memory transistors;

a plurality of source transistors wherein each one of said plurality of source transistors has a gate coupled to a one of said plurality of wordlines a source coupled to a source potential line, and a drain coupled to the sources of each of said plurality of nonvolatile memory transistors associated with said one of said plurality of rows associated with said wordline coupled to said source of said one of said plurality of source transistors;

a plurality of isolation wells in said substrate wherein a portion of said plurality of nonvolatile memory transistors associated with a byte of data are disposed in each of said plurality of isolation wells; and a plurality of well selection transistors wherein each one of said plurality of well selection transistors is connected to a one of said plurality of isolation wells.

3. An array of one-time programmable nonvolatile memory cells arranged in a plurality of rows and a plurality of columns comprising:

a substrate upon which said array is deposited;

a plurality of wordlines wherein each of said plurality of wordlines is associated with a one of said plurality of rows in the array;

a plurality of bitlines wherein each of said plurality of bitlines is associated with one of said plurality of columns in the array;

a plurality of nonvolatile memory transistors, each of said nonvolatile memory transistors associated with a one of said plurality of rows and a one of said plurality of columns in the array, each one of said plurality of nonvolatile memory transistors having a source, a drain, a floating gate and a control gate, the control gate of each one of said plurality of nonvolatile memory transistors coupled to the one of said plurality of wordlines of said one of said plurality of rows associated with said one of said plurality of nonvolatile memory transistor, the drain of each one of said plurality of nonvolatile memory transistors coupled to the one of said plurality of bitlines of said one of said plurality of columns associated with said one of said plurality of nonvolatile memory transistors, the source of each one of said plurality of nonvolatile memory being couple to the source of each of said other ones of said plurality of nonvolatile memory transistors in said one of said plurality of rows associated with said one of said plurality of nonvolatile memory transistors;

a plurality of source transistors wherein each one of said plurality of source transistors has a gate coupled to a one of said plurality of, a source coupled to a source potential line, and a drain coupled to the sources of each of said plurality of nonvolatile memory transistors associated with said one of said plurality of rows associated with said wordline coupled to said source of said one of said plurality of source transistors;

a plurality of isolation well in said substrate wherein a portion of said plurality of nonvolatile memory transistors associated with a byte of data are disposed in each of said plurality of isolation wells; and a plurality of well selection transistors wherein each one of said plurality of well selection transistors is connected to a one of said plurality of isolation wells.

*4. A substrate, comprising:*

*a plurality of nonvolatile memory metal oxide semiconductor (MOS) transistors formed in rows and columns of an array;*

*a plurality of wordlines, one or more of said wordlines being associated with one or more of said rows;*

*a plurality of isolation wells, wherein one or more portions of said plurality of nonvolatile memory MOS transistors associated with one or more portions of data are disposed in associated one or more of said plurality of isolation wells;*

*a plurality of well selection transistors connected to associated ones of said plurality of isolation wells; and*

*a plurality of source transistors, one or more of said source transistors comprising gates coupled to associated one or more of said plurality of wordlines, said source transistors comprising sources coupled to a source potential line.*

*5. The substrate of claim 4 and further comprising a plurality of bitlines, one or more of said bitlines being associated with one or more of said columns.*

*6. The substrate of claim 5, wherein one or more of said nonvolatile memory MOS transistors comprise a drain coupled to associated ones of said bitlines.*

*7. The substrate of claim 4, wherein said nonvolatile memory MOS transistors further comprise a source, wherein a source of a nonvolatile memory MOS transistor in a row is coupled to sources of other nonvolatile memory MOS transistors in said row.*

*8. The substrate of claim 4, wherein one or more of said nonvolatile memory MOS transistors comprise a control gate coupled to an associated one of said wordlines.*

*9. The substrate of claim 4, wherein one or more of said plurality of source transistors further comprise a drain coupled to sources of nonvolatile memory MOS transistors associated with a row of said one or more of said plurality of rows associated with said associated one or more wordlines.*

*10. The substrate of claim 4, wherein said array comprises a stacked array.*

*11. The substrate of claim 4, wherein said array comprises a split gate array.*

*12. The substrate of claim 4, wherein said non-volatile memory MOS transistors are capable of being erased using substantially a uniform channel erase.*

*13. The substrate of claim 4, wherein said one or more portions of data comprise one or more bytes of data.*

*14. The substrate of claim 5, wherein said isolation wells comprise a plurality of N-wells.*

*15. The substrate of claim 5, wherein said isolation wells comprise a plurality of P-wells.*

*16. A method comprising:*

*forming a plurality of nonvolatile memory metal oxide semiconductor (MOS) transistors in a substrate as an array comprising rows and columns;*

*forming a plurality of wordlines in said substrate, one or more of said wordlines being associated with one or more of said rows;*

*forming a plurality of isolation wells in said substrate, wherein one or more portions of said plurality of nonvolatile memory transistors are associated with one or more portions of data and disposed in associated one or more of said plurality of isolation wells;*

*forming a plurality of well selection transistors in said substrate connected to associated ones of said plurality of isolation wells; and*

*forming a plurality of source transistors in said substrate, one or more of said source transistors comprising gates coupled to associated one or more of said plurality of wordlines, said source transistors comprising sources coupled to a source potential line.*

*17. The method of claim 16, and further comprising forming a plurality of bitlines in said substrate, one or more of said bitlines being associated with one or more of said columns.*

*18. The method of claim 17, wherein one or more of said nonvolatile memory MOS transistors comprise a drain coupled to associated ones of said bitlines.*

*19. The method of claim 16, wherein said nonvolatile memory MOS transistors further comprise a source, wherein a source of a nonvolatile memory MOS transistor in a row is coupled to sources of other nonvolatile memory MOS transistors in said row.*

*20. The method of claim 16, wherein one or more of said nonvolatile memory MOS transistors comprise a control gate coupled to an associated one of said wordlines.*

*21. The method of claim 16, wherein one or more of said source transistors further comprises a drain coupled to sources of nonvolatile memory MOS transistors associated with a row of said one of said plurality of rows associated with said wordlines coupled to said sources of said one or more of said plurality of source transistors.*

*22. The method of claim 16, wherein said array comprises a stacked array.*

*23. The method of claim 16, wherein said array comprises a split gate array.*

*24. The method of claim 16, wherein said non-volatile memory MOS transistors are capable of being erased using substantially a uniform channel erase.*

*25. The method of claim 16, wherein said one or more portions of data comprise one or more bytes of data.*

*26. The method of claim 16, wherein said forming said plurality of said isolation wells further comprises forming said plurality of isolation wells in said substrate as a plurality of N-wells.*

*27. The method of claim 16, wherein said forming said plurality of said isolation wells further comprises forming said plurality of isolation wells in said substrate as a plurality of P-wells.*

*28. A nonvolatile memory apparatus comprising:*

*a plurality of metal oxide semiconductor (MOS) transistors formed in one or more rows and in a plurality of*

*isolation wells, wherein one or more wordlines are operatively associated with said one or more of said rows and a plurality of well selection transistors are operatively associated ones of said plurality of isolation wells; and*

*a plurality of source transistors, one or more of said source transistors comprising gates coupled to associated one or more of said plurality of wordlines, said source transistors comprising sources coupled to a source potential line.*

*29. The nonvolatile memory apparatus of claim 28, wherein said plurality of metal oxide semiconductor (MOS) transistors comprises a stacked array.*

*30. The nonvolatile memory apparatus of claim 28, wherein said plurality of metal oxide semiconductor (MOS) transistors comprises a split gate array.*

*31. The nonvolatile memory apparatus of claim 28, wherein said nonvolatile memory apparatus comprises a Flash memory device.*

*32. The nonvolatile memory apparatus of claim 28, wherein said nonvolatile memory apparatus comprises an erasable programmable read only memory (EPROM) memory device.*

*33. The nonvolatile memory apparatus of claim 28, wherein said nonvolatile memory apparatus comprises an electrically erasable programmable read only memory (EEPROM) memory device.*

*34. A method for use with a nonvolatile memory apparatus, the method comprising:*

*selectively causing a source of at least one source transistor having a gate coupled to at least one wordline to electrically float; and*

*selectively erasing at least one memory cell comprising one or more metal oxide semiconductor (MOS) transistors formed in at least one row and in at least one isolation well, wherein said at least one wordline is operatively associated with said at least one row and at least one well selection transistor is operatively associated with said at least one isolation well.*

*35. A method for use with a nonvolatile memory apparatus, the method comprising:*

*selectively causing a source of at least one source transistor having a gate coupled to at least one wordline to not electrically float; and*

*selectively programming or reading at least one memory cell comprising one or more metal oxide semiconductor (MOS) transistors formed in at least one row and in at least one isolation well, wherein said at least one wordline is operatively associated with said at least one row and at least one well selection transistor is operatively associated with said at least one isolation well.*

* * * * *

UNITED STATES PATENT AND TRADEMARK OFFICE

CERTIFICATE OF CORRECTION

PATENT NO. : RE 40,976 E
APPLICATION NO. : 11/198860
DATED : November 17, 2009
INVENTOR(S) : Albert Bergemont et al.

It is certified that error appears in the above-identified patent and that said Letters Patent is hereby corrected as shown below:

Column 17, line 22 (Claim 1): Delete "rows" and replace with -- rows and --;

Column 19, line 10 (Claim 3): Delete "of," and replace with -- of --;

Column 19, line 42 (Claim 5): Delete "claim 4" and replace with -- claim 4, --;

Column 20, line 3 (Claim 14): Delete "claim 5" and replace with -- claim 4, --; and Column 20, line 5 (Claim 15): Delete "claim 5" and replace with -- claim 4, --.

Signed and Sealed this

Sixteenth Day of November, 2010

David J. Kappos

David J. Kappos
*Director of the United States Patent and Trademark Office*